(12) United States Patent
Hollerbach et al.

(10) Patent No.: US 10,331,038 B2
(45) Date of Patent: Jun. 25, 2019

(54) REAL TIME SOFTWARE AND ARRAY CONTROL

(71) Applicant: Applied Materials, Inc., Santa Clara, CA (US)

(72) Inventors: Uwe Hollerbach, Fremont, CA (US); Thomas L. Laidig, Richmond, CA (US); Mark Hunt, Morgan Hill, CA (US); Don Starses, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 250 days.

(21) Appl. No.: 15/078,419

(22) Filed: Mar. 23, 2016

(65) Prior Publication Data
US 2016/0282849 A1   Sep. 29, 2016

Related U.S. Application Data

(60) Provisional application No. 62/137,775, filed on Mar. 24, 2015.

(51) Int. Cl.
*G05B 19/4099* (2006.01)
*G03F 7/20* (2006.01)

(52) U.S. Cl.
CPC ...... *G03F 7/70358* (2013.01); *G03F 7/70258* (2013.01); *G03F 7/70275* (2013.01); *G03F 7/70291* (2013.01); *G03F 7/70508* (2013.01); *G03F 7/70783* (2013.01); *G05B 2219/45028* (2013.01)

(58) Field of Classification Search
CPC ............ G03F 7/70258; G03F 7/70275; G03F 7/70291; G03F 7/70358; G03F 7/70508; G03F 7/70783; G05B 2219/45028
See application file for complete search history.

(56) References Cited

U.S. PATENT DOCUMENTS

| | | | |
|---|---|---|---|
| 2002/0036762 A1* | 3/2002 | Nishi | G03F 7/2022 355/53 |
| 2006/0132734 A1* | 6/2006 | Luttikhuis | G03F 7/70616 355/53 |
| 2013/0003029 A1* | 1/2013 | Laidig | G03F 7/70291 355/53 |
| 2018/0034240 A1 | 2/2018 | Qiao | |

* cited by examiner

*Primary Examiner* — Yuhui R Pan
(74) *Attorney, Agent, or Firm* — Patterson + Sheridan LLP

(57) ABSTRACT

A real time software and array control software application platform which maintains the ability to manage the synchronization between substrate alignments and image projection systems during maskless lithography patterning in a manufacturing process is disclosed. The application coordinates and controls the image projection systems such that discrepancies in and misalignments of the substrate may be determined and accounted for in real time. The image projection systems may run in parallel and may be controlled by a central processor.

24 Claims, 10 Drawing Sheets

REAL TIME SOFTWARE AND ARRAY CONTROL

CROSS-REFERENCE TO RELATED APPLICATIONS

This application claims benefit of U.S. Provisional Patent Application Ser. No. 62/137,775 filed Mar. 24, 2015, which is incorporated by reference herein.

BACKGROUND

Field

Embodiments of the present disclosure generally relate to the field of maskless lithography. More specifically, embodiments provided herein relate to a system and method for performing maskless digital lithography manufacturing processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels may include a layer of liquid crystal material forming pixels sandwiched between two plates. When power from the power supply is applied across the liquid crystal material, an amount of light passing through the liquid crystal material may be controlled at pixel locations enabling images to be generated.

Microlithography techniques are generally employed to create electrical features incorporated as part of the liquid crystal material layer forming the pixels. According to this technique, a light-sensitive photoresist is typically applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide display devices and other devices to consumers at the prices demanded by consumers, new apparatuses, approaches, and systems are needed to precisely and cost-effectively create patterns on substrates, such as large area substrates.

As the foregoing illustrates, there is a need for an improved technique for the real time management of image projection systems within digital lithography. More specifically, what is needed in the art is a real time software and array control application which detects the location and orientation of a substrate and manages a synchronization of image projection systems, all in real time.

SUMMARY

The present disclosure generally relates to a real time software and array control software application platform which maintains the ability to manage the synchronization between substrates and image projection systems during maskless lithography patterning in a manufacturing process. In one embodiment, a method for the real time coordination of image projection systems is disclosed. The method includes detecting a location and an orientation of a substrate within a processing unit, and activating at least two image projection systems. The method further includes coordinating the at least two image projection systems, controlling the at least two image projection systems, wherein the controlling aligns the at least two image projection systems with an alignment of the substrate, and processing the substrate in the processing unit.

In another embodiment, a computer system for performing the real time coordination of image projection systems is disclosed. The computer system for performing the real time coordination of image projection systems includes a processor and a memory storing instructions that, when executed by the processor, cause the computer system to detect a location and an orientation of a substrate within a processing unit, and activate at least two image projection systems. The memory may also store instructions that, when executed by the processor, cause the computer system to coordinate the at least two image projection systems, control the at least two image projection systems, wherein the controlling aligns the at least two image projection systems with an alignment of the substrate, and process the substrate in the processing unit.

In yet another embodiment, a non-transitory computer-readable medium, storing instructions that, when executed by a processor, cause a computer system to coordinate image projection systems in real time is disclosed. The processor may perform the steps of detecting a location and an orientation of a substrate within a processing unit, and activating at least two image projection systems. The processor may also perform the steps of coordinating the at least two image projection systems, controlling the at least two image projection systems, wherein the controlling aligns the at least two image projection systems with an alignment of the substrate, and processing the substrate in the processing unit.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments of this disclosure and are therefore not to be considered limiting of its scope, for the disclosure may be applied to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to a real time software and array control software application platform which maintains the ability to manage the synchronization between substrates and image projection systems during maskless lithography patterning in a manufacturing process. The application coordinates and controls the image projection systems such that discrepancies in and misalignments of the substrate may be accounted for in real time. The image projection systems may run in parallel and may be controlled by a central processor.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

Figure 1:
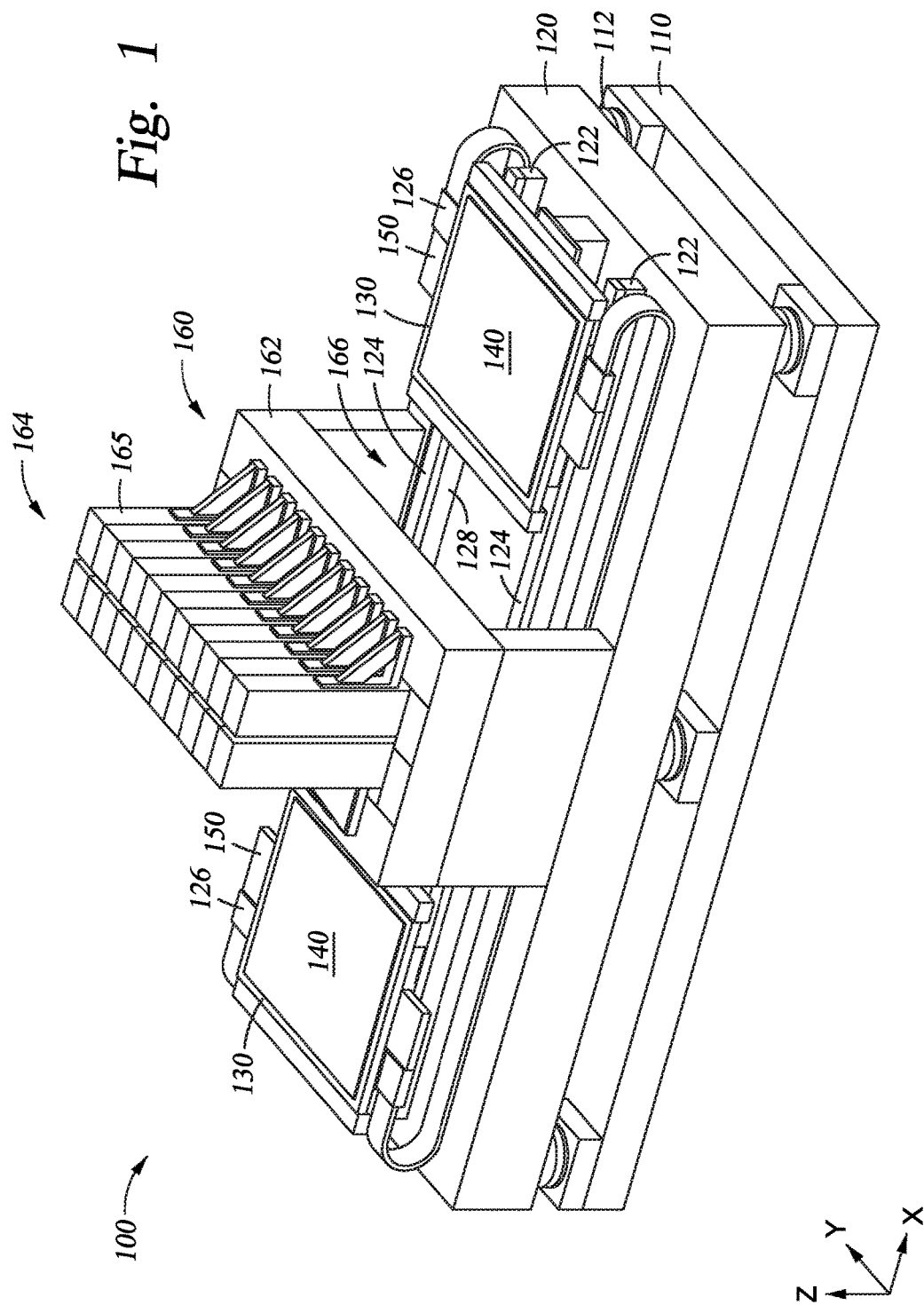
FIG. 1 is a perspective view of a system that may benefit from embodiments disclosed herein.

FIG. 1 is a perspective view of a system 100 that may benefit from embodiments disclosed herein. The system 100 includes a base frame 110, a slab 120, two or more stages 130, and a processing apparatus 160. In certain embodiments, one stage 130 may be used. The base frame 110 may rest on the floor of a fabrication facility and may support the slab 120. Passive air isolators 112 may be positioned between the base frame 110 and the slab 120. The slab 120 may be a monolithic piece of granite, and the two or more stages 130 may be disposed on the slab 120. A substrate 140 may be supported by each of the two or more stages 130. A plurality of holes (not shown) may be formed in the stage 130 for allowing a plurality of lift pins (not shown) to extend therethrough. The lift pins may rise to an extended position to receive the substrate 140, such as from a transfer robot (not shown). The transfer robot may position the substrate 140 on the lift pins, and the lift pins may thereafter gently lower the substrate 140 onto the stage 130.

The substrate 140 may, for example, be made of quartz and be used as part of a flat panel display. In other embodiments, the substrate 140 may be made of other materials. In some embodiments, the substrate 140 may have a photoresist layer formed thereon. A photoresist is sensitive to radiation and may be a positive photoresist or a negative photoresist, meaning that portions of the photoresist exposed to radiation will be respectively soluble or insoluble to a photoresist developer applied to the photoresist after the pattern is written into the photoresist. The chemical composition of the photoresist determines whether the photoresist will be a positive photoresist or negative photoresist. For example, the photoresist may include at least one of diazonaphthoquinone, a phenol formaldehyde resin, poly(methyl methacrylate), poly(methyl glutarimide), and SU-8. In this manner, the pattern may be created on a surface of the substrate 140 to form the electronic circuitry.

The system 100 may further include a pair of supports 122 and a pair of tracks 124. The pair of supports 122 may be disposed on the slab 120, and the slab 120 and the pair of supports 122 may be a single piece of material. The pair of tracks 124 may be supported by the pair of the supports 122, and the two or more stages 130 may move along the tracks 124 in the X-direction. In one embodiment, the pair of tracks 124 is a pair of parallel magnetic channels. As shown, each track 124 of the pair of tracks 124 is linear. In other embodiments, the track 124 may have a non-linear shape. An encoder 126 may be coupled to each stage 130 in order to provide location information to a controller 702 (See FIG. 9).

The processing apparatus 160 may include a support 162 and a processing unit 164. The support 162 may be disposed on the slab 120 and may include an opening 166 for the two or more stages 130 to pass under the processing unit 164. The processing unit 164 may be supported by the support 162. In one embodiment, the processing unit 164 is a pattern generator configured to expose a photoresist in a photolithography process. In some embodiments, the pattern generator may be configured to perform a maskless lithography process. The processing unit 164 may include a plurality of image projection systems (shown in FIG. 3) disposed in a case 165. The processing apparatus 160 may be utilized to perform maskless direct patterning. During operation, one of the two or more stages 130 moves in the X-direction from a loading position, as shown in FIG. 1, to a processing position. The processing position may refer to one or more positions of the stage 130 as the stage 130 passes under the processing unit 164. During operation, the two or more stages 130 may be lifted by a plurality of air bearings 202 (shown in FIG. 2) and may move along the pair of tracks 124 from the loading position to the processing position. A plurality of vertical guide air bearings (not shown) may be coupled to each stage 130 and positioned adjacent an inner wall 128 of each support 122 in order to stabilize the movement of the stage 130. Each of the two or more stages 130 may also move in the Y-direction by moving along a track 150 for processing and/or indexing the substrate 140.

Figure 2:
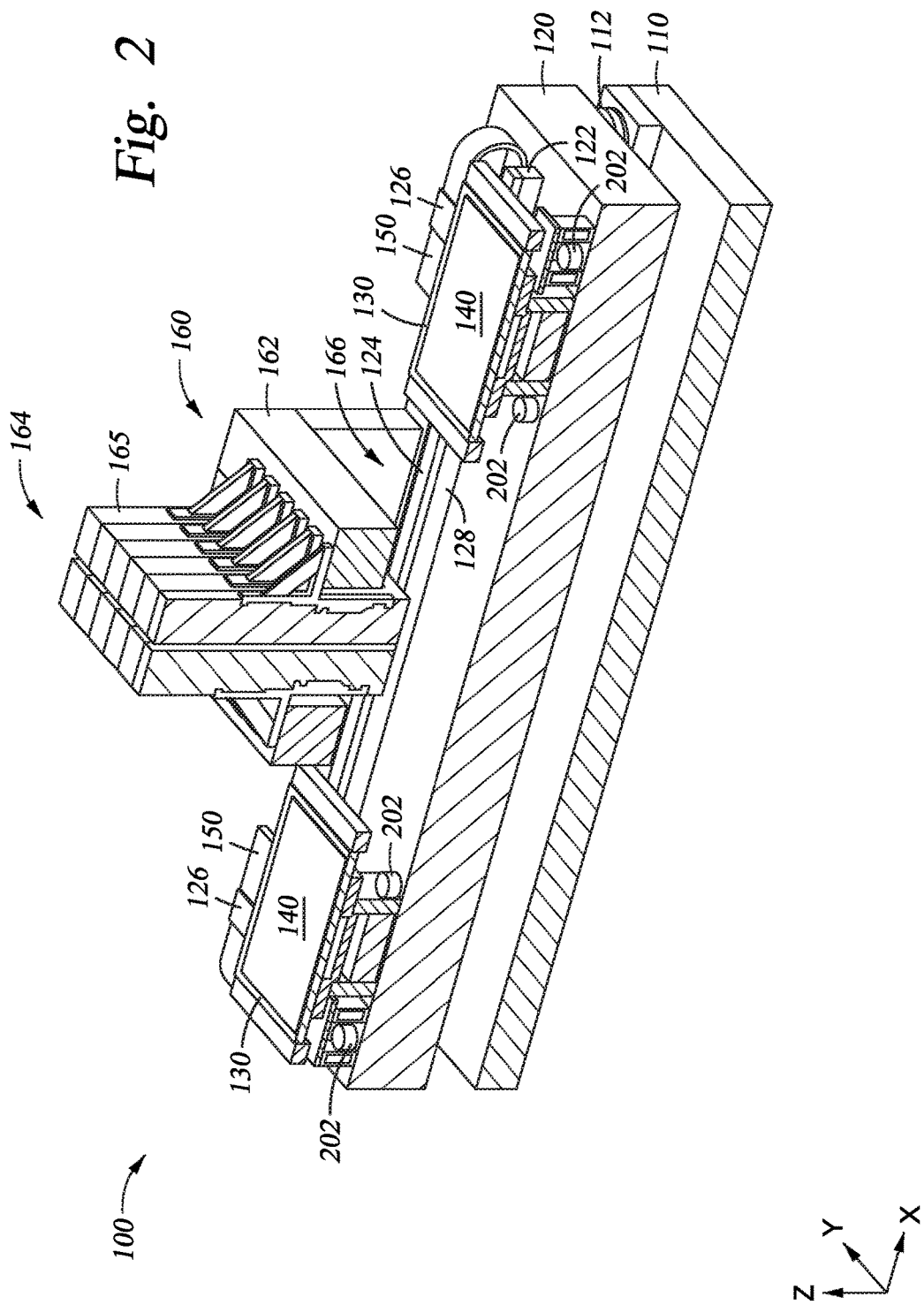
FIG. 2 is a cross-sectional side view of the system of FIG. 1 according to one embodiment.

FIG. 2 is a cross-sectional side view of the system 100 of FIG. 1 according to one embodiment. As shown, each stage 130 includes a plurality of air bearings 202 for lifting the stage 130. Each stage 130 may also include a motor coil (not shown) for moving the stage 130 along the tracks 124. The two or more stages 130 and the processing apparatus 160 may be enclosed by an enclosure (not shown) in order to provide temperature and pressure control.

Figure 3:
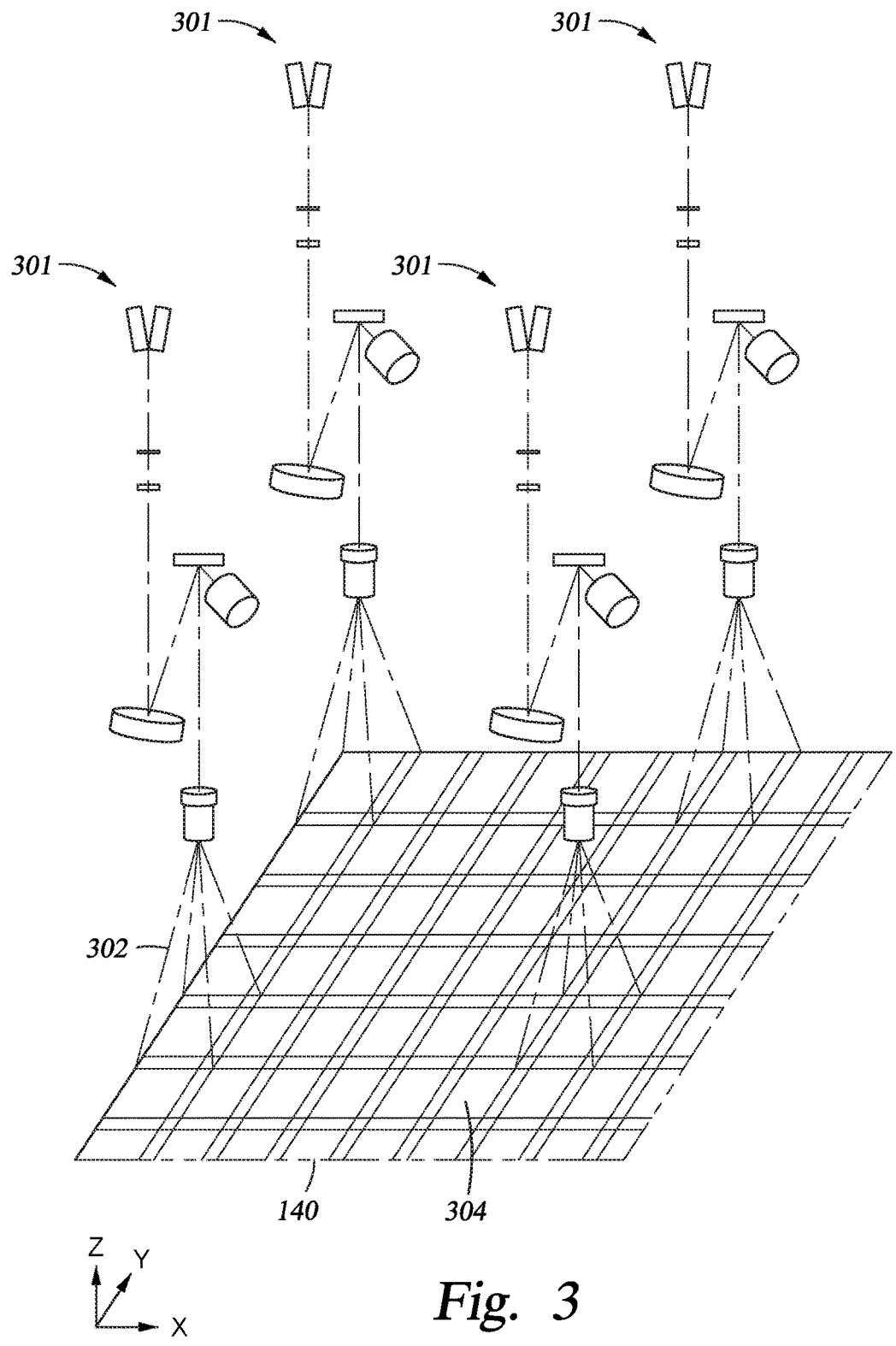
FIG. 3 is a perspective schematic view of a plurality of image projection systems according to one embodiment.

FIG. 3 is a perspective schematic view of a plurality of image projection systems 301 according to one embodiment. As shown in FIG. 3, each image projection system 301 produces a plurality of write beams 302 onto a surface 304 of the substrate 140. As the substrate 140 moves in the X-direction and Y-direction, the entire surface 304 may be patterned by the write beams 302. The number of the image projection systems 301 may vary based on the size of the substrate 140 and/or the speed of stage 130. In one embodiment, there are 22 image projection systems 164 in the processing apparatus 160.

Figure 4:
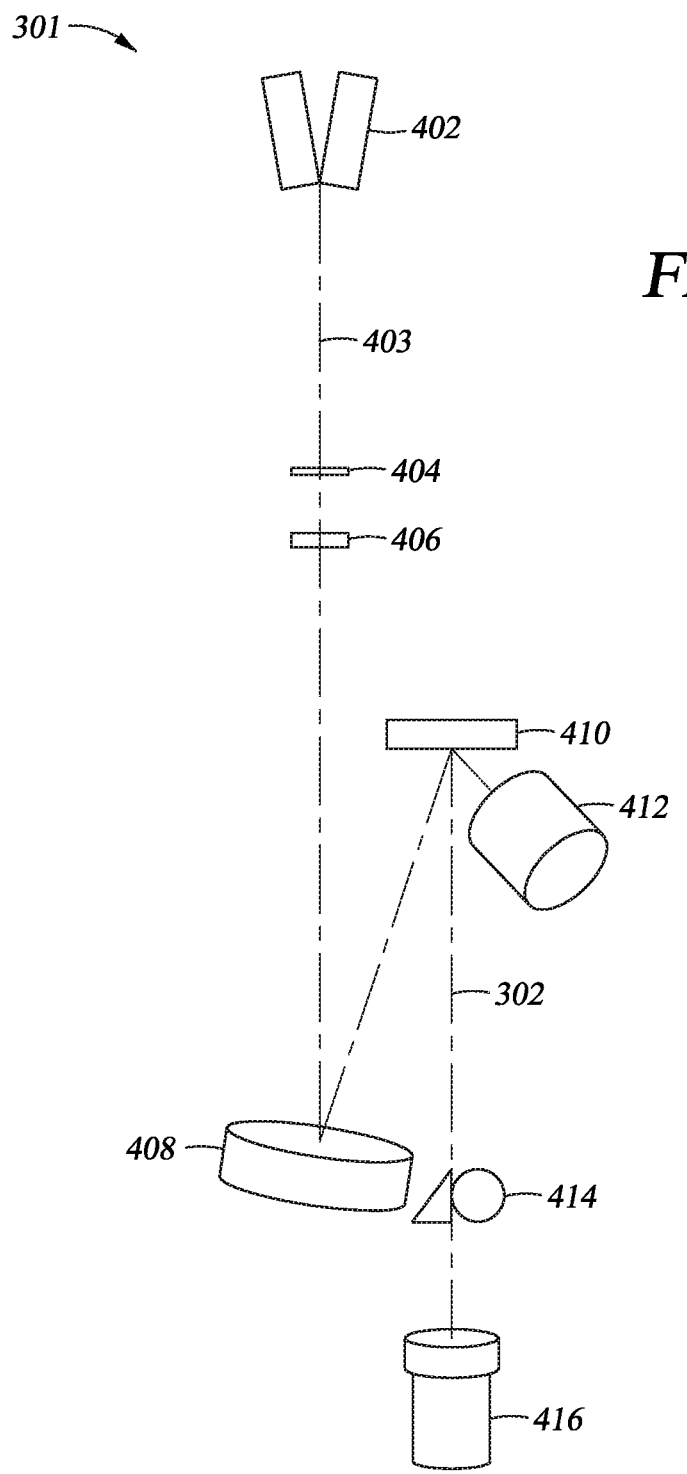
FIG. 4 is a perspective schematic view of an image projection system of the plurality of image projection devices of FIG. 3 according to one embodiment.

FIG. 4 is a perspective schematic view of one image projection system 301 of the plurality of image projection systems 301 of FIG. 3 according to one embodiment. The image projection system 301 may include a light source 402, an aperture 404, a lens 406, a mirror 408, a DMD 410, a light dump 412, a camera 414, and a projection lens 416. The light source 402 may be a light emitting diode (LED) or a laser, and the light source 402 may be capable of producing a light having predetermined wavelength. In one embodiment, the predetermined wavelength is in the blue or near ultraviolet (UV) range, such as less than about 450 nm. The mirror 408 may be a spherical mirror. The projection lens 416 may be a 10× objective lens. The DMD 410 may include a plurality of mirrors, and the number of mirrors may correspond to the resolution of the projected image. In one embodiment, the DMD 410 includes 1920×1080 mirrors.

During operation, a beam 403 having a predetermined wavelength, such as a wavelength in the blue range, is produced by the light source 402. The beam 403 is reflected to the DMD 410 by the mirror 408. The DMD 410 includes a plurality of mirrors that may be controlled individually, and each mirror of the plurality of mirrors of the DMD 410 may be at "on" position or "off" position, based on the mask data provided to the DMD 410 by the controller (not shown). When the beam 403 reaches the mirrors of the DMD 410, the mirrors that are at "on" position reflect the beam 403, i.e., forming the plurality of write beams 302, to the projection lens 416. The projection lens 416 then projects the write beams 302 to the surface 304 of the substrate 140. The mirrors that are at "off" position reflect the beam 403 to the light dump 412 instead of the surface 304 of the substrate 140.

Figure 5:
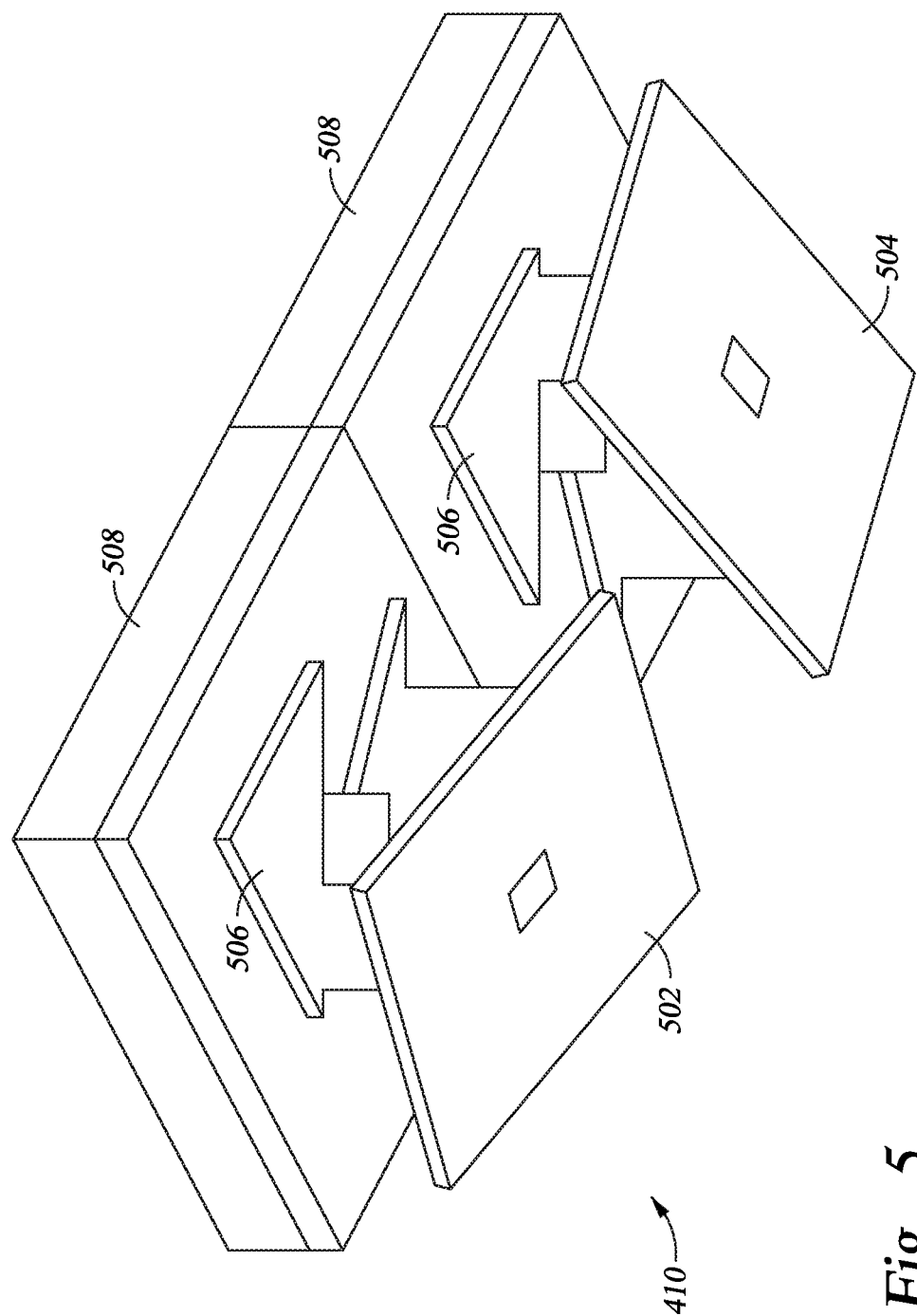
FIG. 5 is an enlarged perspective view of two mirrors of a DMD according to one embodiment.

FIG. 5 is an enlarged perspective view of two mirrors 502, 504 of the DMD 410 according to one embodiment. As shown, each mirror 502, 504 is disposed on a tilting mechanism 506, which is disposed on a memory cell 508. The memory cell 508 may be a CMOS SRAM. During operation, each mirror 502, 504 is controlled by loading the mask data into the memory cell. The mask data electrostatically controls the tilting of the mirror 502, 504 in a binary fashion. When the mirror 502, 504 is in a reset mode or without power applied, it may be set to a flat position, not corresponding to any binary number. Zero in binary may correspond to an "off" position, which means the mirror is tilted at −10 degrees, −12 degrees, or any other feasibly negative tilting degree. One in binary may correspond to an "on" position, which means the mirror is tilted at +10 degrees, +12 degrees, or any other feasibly positive tilting degree. As shown in FIG. 5, the mirror 502 is at "off" position and the mirror 504 is at "on" position.

Figure 6:
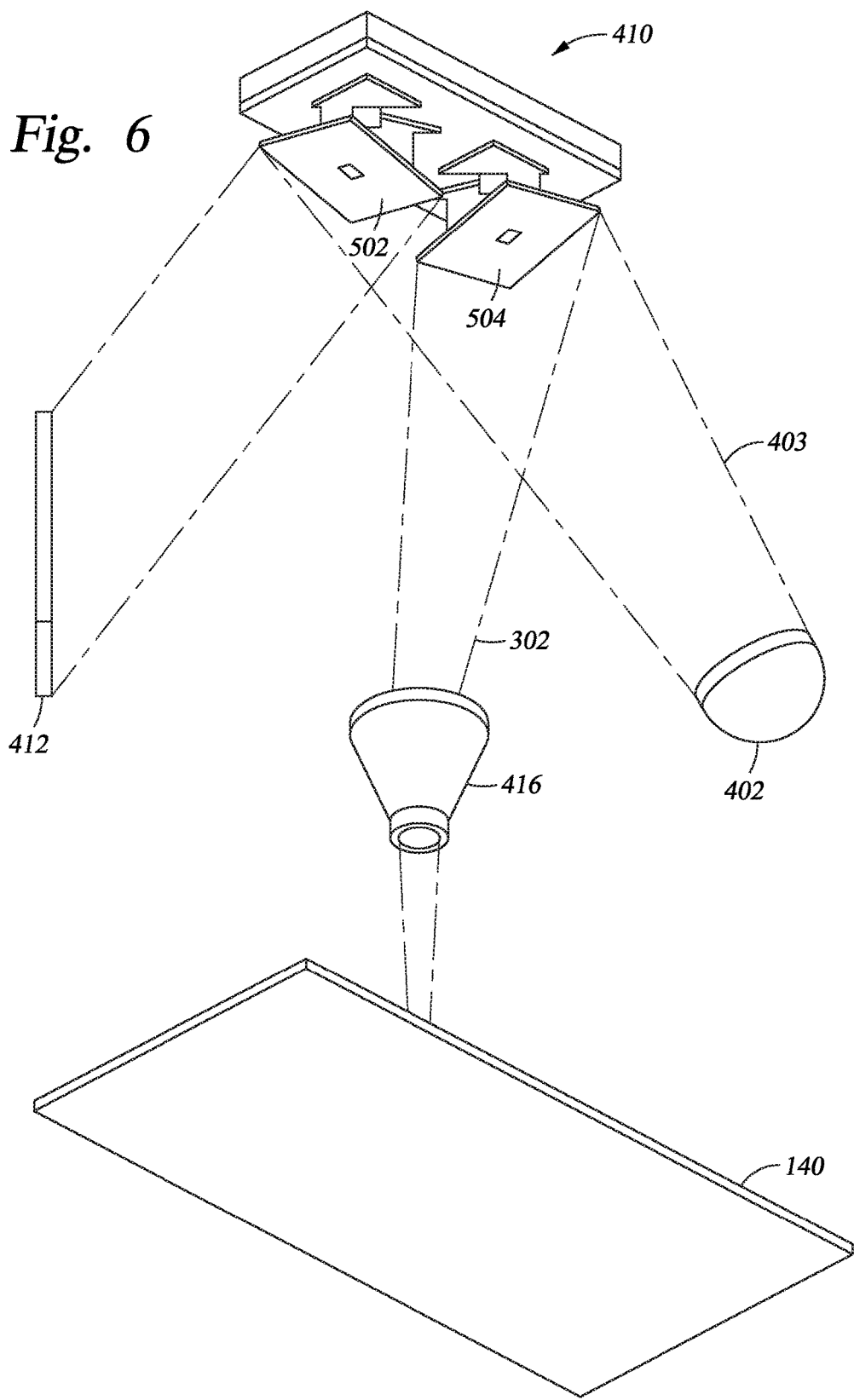
FIG. 6 schematically illustrates a beam being reflected by the two mirrors of the DMD of FIG. 5 according to one embodiment.

FIG. 6 schematically illustrates the beam 403 being reflected by the two mirrors 502, 504 of the DMD 410 of FIG. 5 according to one embodiment. As shown, the mirror 502, which is at "off" position, reflects the beam 403 generated from the light source 402 to the light dump 412. The mirror 504, which is at "on" position, forms the write beam 302 by reflecting the beam 403 to the projection lens 416.

Figure 7:
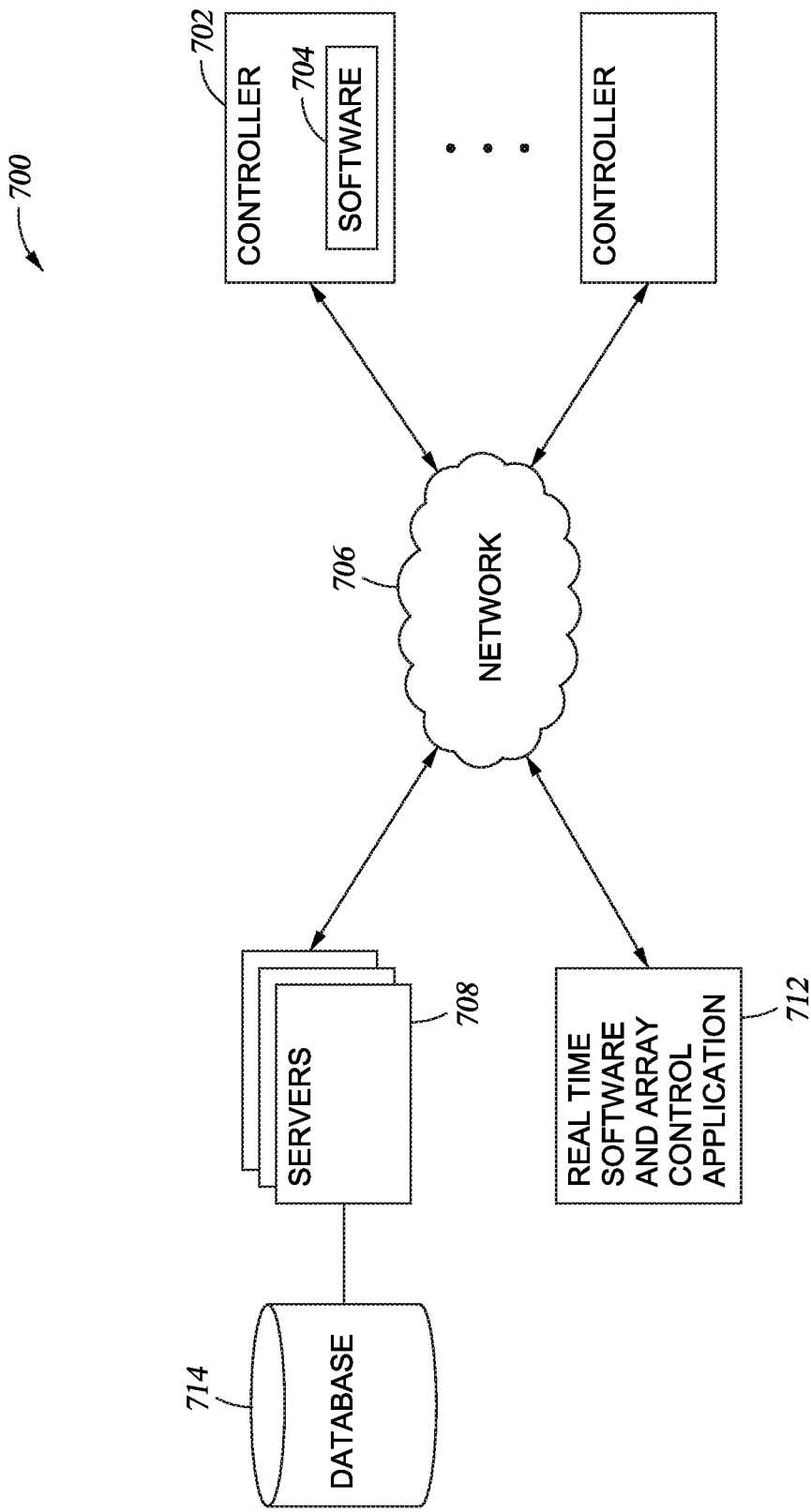
FIG. 7 illustrates a computer system for providing a real time software and array control application for managing the synchronization between substrates and image projection systems during maskless lithography according to one embodiment described herein.

FIG. 7 illustrates a computing system 700 configured to provide a real time software and array control software application platform in which embodiments of the disclosure may be practiced. As shown, the computing system 700 may include a plurality of servers 708, a real time software and array control application server 712, and a plurality of controllers (i.e., computers, personal computers, mobile/wireless devices) 702 (only two of which are shown for clarity), each connected to a communications network 706 (for example, the Internet). The servers 708 may communicate with the database 714 via a local connection (for example, a Storage Area Network (SAN) or Network Attached Storage (NAS)) or over the Internet. The servers 708 are configured to either directly access data included in the database 714 or to interface with a database manager that is configured to manage data included within the database 714.

Each controller 702 may include conventional components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 708 and the real time software and array control application server 712 may include a processor and a system memory (not shown), and may be configured to manage content stored in database 714 using, for example, relational database software and/or a file system. The servers 708 may be programmed to communicate with one another, the controllers 702, and the real time software and array control server 712 using a network protocol such as, for example, the TCP/IP protocol. The real time software and array control application server 712 may communicate directly with the controllers 702 through the communications network 706. The controllers 702 are programmed to execute software 704, such as programs and/or other software applications, and access applications managed by servers 708.

In the embodiments described below, users may respectively operate the controllers 702 that may be connected to the servers 708 over the communications network 706. Pages, images, data, documents, and the like may be displayed to a user via the controllers 702. Information and images may be displayed through a display device and/or a graphical user interface in communication with the controller 702.

It is noted that the controller 702 may be a personal computer, laptop mobile computing device, smart phone, video game console, home digital media player, network-connected television, set top box, and/or other computing devices having components suitable for communicating with the communications network 706 and/or the applications or software. The controller 702 may also execute other software applications configured to receive content and information from the real time software and array control application 712.

Figure 8:
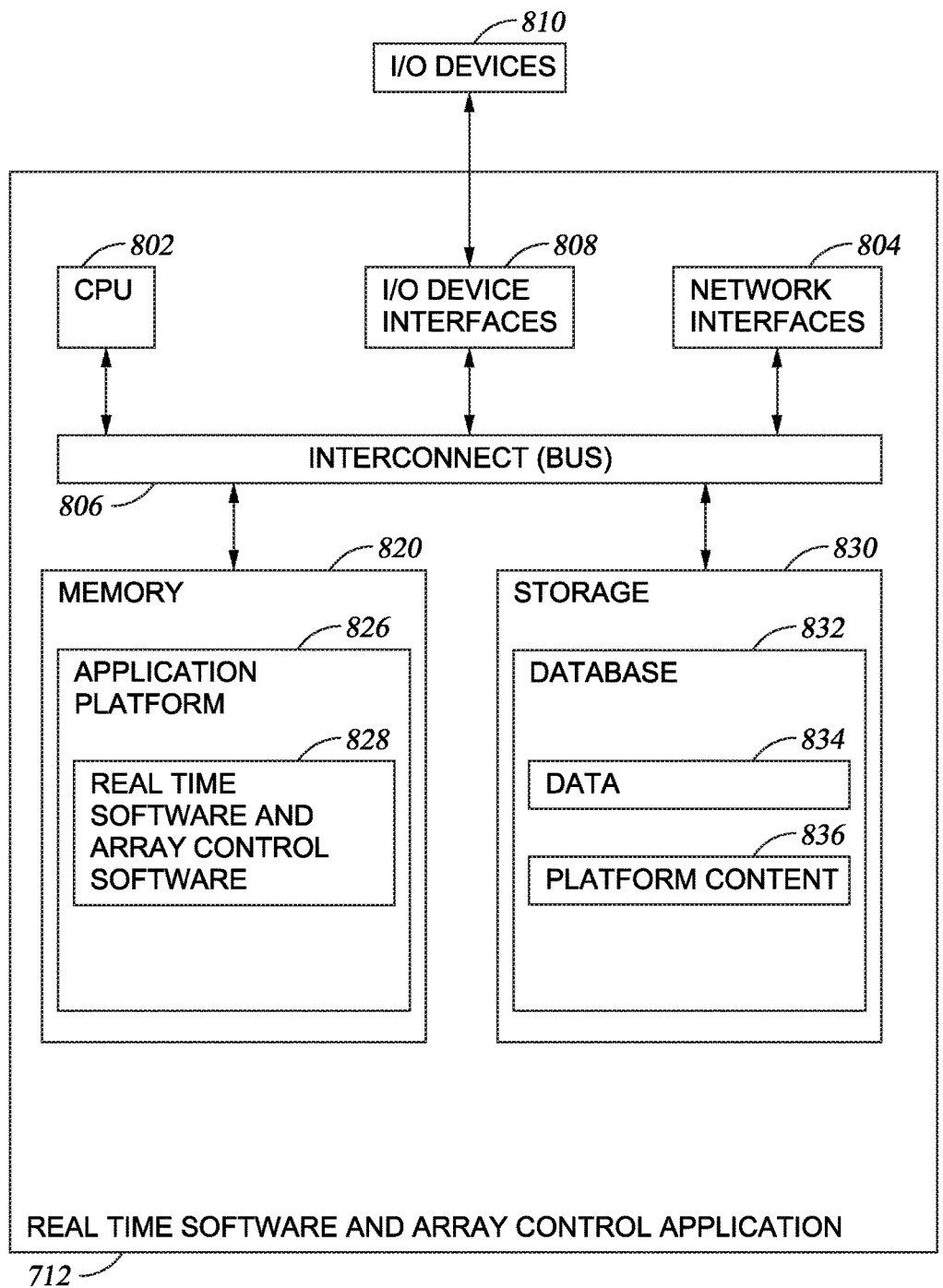
FIG. 8 illustrates a more detailed view of a server of FIG. 7 according to one embodiment described herein.

FIG. 8 illustrates a more detailed view of the real time software and array control application server 712 of FIG. 7. The real time software and array control application server 712 includes, without limitation, a central processing unit (CPU) 802, a network interface 804, memory 820, and storage 830 communicating via an interconnect 806. The real time software and array control application server 712 may also include I/O device interfaces 808 connecting I/O devices 810 (for example, keyboard, video, mouse, audio, touchscreen, etc.). The real time software and array control application 712 may further include the network interface 804 configured to transmit data via the communications network 706.

The CPU 802 retrieves and executes programming instructions stored in the memory 820 and generally controls and coordinates operations of other system components. Similarly, the CPU 802 stores and retrieves application data residing in the memory 820. The CPU 802 is included to be representative of a single CPU, multiple CPU's, a single CPU having multiple processing cores, and the like. The interconnect 806 is used to transmit programming instructions and application data between the CPU 802, I/O device interfaces 808, storage 830, network interfaces 804, and memory 820.

The memory 820 is generally included to be representative of a random access memory and, in operation, stores software applications and data for use by the CPU 802. Although shown as a single unit, the storage 830 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 820 may store instructions and logic for executing an application platform 826 which may include real time software and array control software 828. The storage 830 may include a database 832 configured to store data 834 and associated application platform content 836. The database 832 may be any type of storage device.

Network computers are another type of computer system that can be used in conjunction with the disclosures provided herein. Network computers do not usually include a hard disk or other mass storage, and the executable programs are loaded from a network connection into the memory 820 for execution by the CPU 802. A typical computer system will usually include at least a processor, memory, and an interconnect coupling the memory to the processor.

Figure 9:
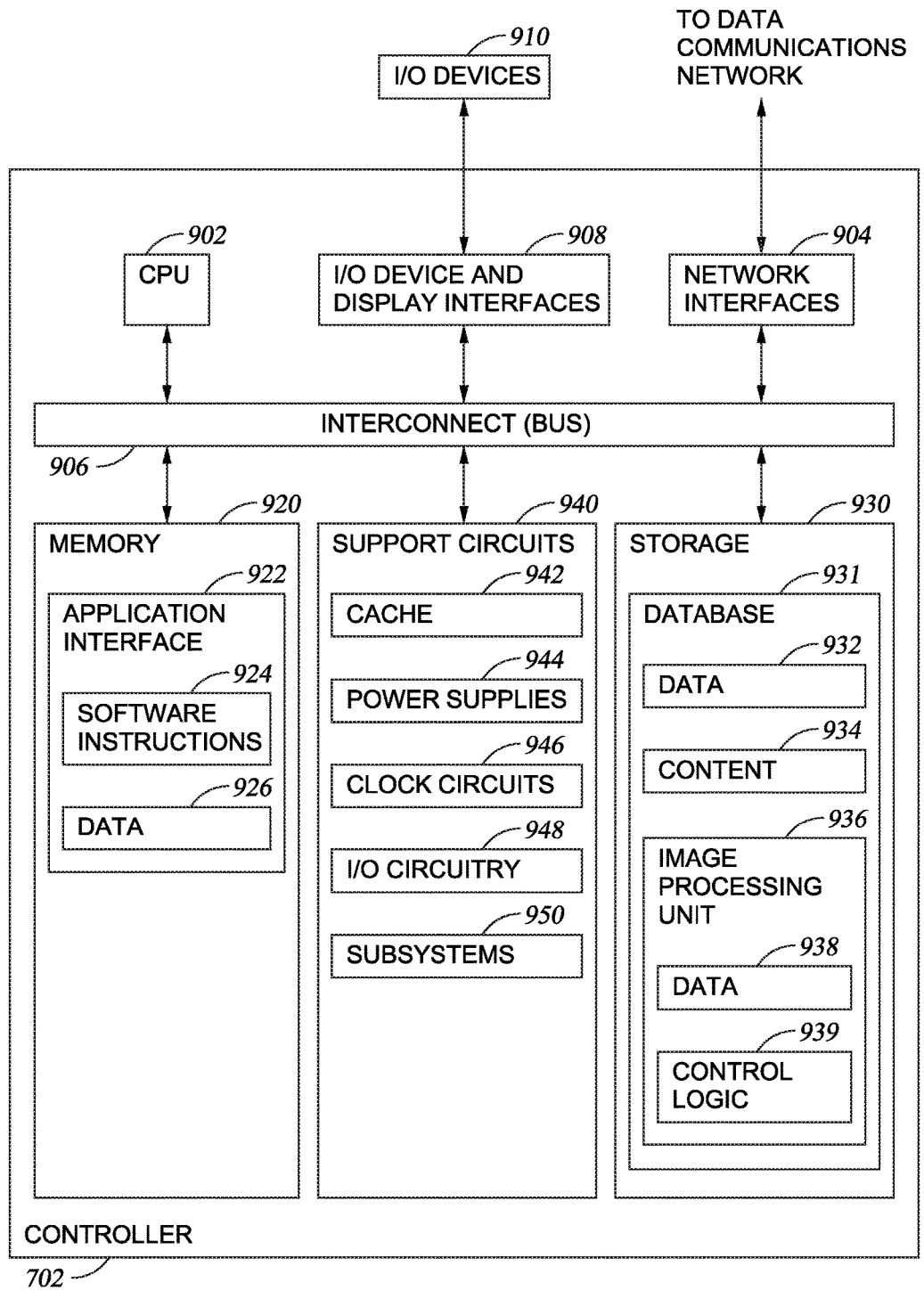
FIG. 9 illustrates a controller computing system used to access a real time software and array control application for managing the synchronization between substrates and image projection systems during maskless lithography according to one embodiment described herein.

FIG. 9 illustrates a controller 702 used to access the real time software and array control application 712 and retrieve or display data associated with the application platform 826. The controller 702 may include, without limitation, a central processing unit (CPU) 902, a network interface 904, an interconnect 906, a memory 920, storage 930, and support circuits 940. The controller 702 may also include an I/O device interface 908 connecting I/O devices 910 (for example, keyboard, display, touchscreen, and mouse devices) to the controller 702.

Like CPU 802, CPU 902 is included to be representative of a single CPU, multiple CPU's, a single CPU having multiple processing cores, etc., and the memory 920 is generally included to be representative of a random access memory. The interconnect 906 may be used to transmit programming instructions and application data between the CPU 902, I/O device interfaces 908, storage 930, network interface 904, and memory 920. The network interface 904 may be configured to transmit data via the communications network 706, for example, to transfer content from the real time software and array control application server 712. Storage 930, such as a hard disk drive or solid-state storage drive (SSD), may store non-volatile data. The storage 930 may contain a database 931. The database 931 may contain data 932 and other content 934. Illustratively, the memory 920 may include an application interface 922, which itself may display software instructions 924, and/or store or display data 926. The application interface 922 may provide one or more software applications which allow the controller to access data and other content hosted by the real time software and array control application server 712.

As shown in FIG. 9, the system 100 includes a controller 702. The controller 702 is generally designed to facilitate the control and automation of the processing techniques described herein. The controller 702 may be coupled to or in communication with one or more of the processing apparatus 160, the stages 130, and the encoder 126. The processing apparatus 160 and the stages 130 may provide information to the controller 702 regarding the substrate processing and the substrate aligning. For example, the processing apparatus 160 may provide information to the controller 702 to alert the controller that substrate processing has been completed. The encoder 126 may provide location information to the controller 702, and the location information is then used to control the stages 130 and the processing apparatus 160.

The controller 702 may include a central processing unit (CPU) 902, memory 920, and support circuits 940 (or I/O 908). The CPU 902 may be one of any form of computer processors that are used in industrial settings for controlling various processes and hardware (e.g., pattern generators, motors, and other hardware) and monitor the processes (e.g., processing time and substrate position). The memory 920, as shown in FIG. 9, is connected to the CPU 902, and may be one or more of a readily available memory, such as random access memory (RAM), read only memory (ROM), floppy disk, hard disk, or any other form of digital storage, local or remote. Software instructions and data can be coded and stored within the memory for instructing the CPU 902. The support circuits 940 are also connected to the CPU 902 for supporting the processor in a conventional manner. The support circuits 940 may include conventional cache 942, power supplies 944, clock circuits 946, input/output circuitry 948, subsystems 950, and the like. A program (or computer instructions) readable by the controller 702 determines which tasks are performable on a substrate. The program may be software readable by the controller 702 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the method operations. The structure for a variety of these systems will appear from the description above. In addition, the present examples are not described with reference to any particular programming language, and various examples may thus be implemented using a variety of programming languages.

As described in greater detail within, embodiments of the disclosure provide a software application through which the synchronization of image projection systems and the alignment of a substrate can be managed in real time in order to provide coordination amongst the image projection systems and account for misalignments within the system during maskless lithography patterning in a manufacturing process. The application coordinates and controls the image projection systems such that discrepancies in and misalignments of the substrate may be accounted for in real time. The image projection systems may run in parallel and may be controlled by a central processor.

In one embodiment, a method for the real time coordination of image projection systems 301 is disclosed. The method may be performed by a controller 702, as shown in FIG. 9.

As discussed with reference to FIG. 3, supra, each image projection system 301 produces a plurality of write beams 302 onto a surface 304 of the substrate 140, and, as the substrate 140 moves in the X-direction and Y-direction, the entire surface 304 may be patterned by the write beams 302. The image projection systems 301 may expose a substrate 140 and deliver light to the surface of the substrate 140. However, as the substrate 140 is placed on and supported by each of the two or more stages 130, the substrate 140 may not be aligned correctly with the process chamber. A misalignment may be slight, such as for example a misalignment in the X or Y direction. A misalignment of the substrate 140 may cause a straight pattern laid on the substrate 140 to be misaligned. If a straight aligned pattern is laid on a misaligned substrate 140 the pattern will appear to be misaligned. A misaligned pattern may be a distortion of the pattern, i.e. a crooked pattern. In some embodiments, the distortion may be caused by various pieces of the substrate 140 moving with respect to one another. For example, a localized heating of the substrate 140 may cause a thermal expansion of the substrate 140 at a first location, or other processing steps may cause the substrate 140 to locally stretch, shrink, or otherwise become strained—all of which create a distortion. As such, the pattern may be adjusted so that the pattern in is aligned with the misaligned substrate 140. By correcting the misalignment of the pattern to be aligned with the misaligned substrate 140, the pattern is laid correctly on the substrate 140. Furthermore, the pattern may be adjusted to correct for the distortions. Each of the image projection systems 301 may allow for the processing of one or more graphical objects of the surface 304 of the substrate 140. Processing of the graphical objects may generate and/or partition the one or more graphical objects into a plurality of convex polygons. To facilitate parallel image processing acceleration, the polygons may be tessellated into convex polygons, such as trapezoids and/or triangles.

In some embodiments, rotations, stretching, shrinking, and/or other non-linear transformations of the layout pattern may be performed to compensate for the misalignment of the substrate 140, a rotation of the substrate 140, and/or a distortion of the substrate 140. In other embodiments, a tilting of the substrate 140 and/or an adjustment of the tilting mechanism 506 of each mirror 502, 504 may compensate for the misalignment of the layout pattern. It is further contemplated that the optical system and/or a component of the optical system, for example, a lens or set of lenses, may be raised or lowered vertically to correct for a height distortion of the layout pattern and/or the substrate 140. In some embodiments, the height distortion may be compensated for on the fly by vertically adjusting a component of the optical system. In some embodiments, the optical system may include the DMD 410.

A location and an orientation of a substrate 140 within a processing unit may be detected. The detecting may be accomplished through the use of sensors, lasers, lights, and/or any other suitable detecting means within the processing unit. The detecting may read a distortion of the substrate and determine instructions for the adjustment of the image projection systems 301. The instructions may be stored as data 938 in an image processing unit 936 of the storage 930 of the controller 702. The instructions, stored as data 938, may be updated as the substrate 140 is further processed. The image processing unit 936 may contain control logic 939 configured to apply the instructions for the adjustment of the image projection systems 301. The control logic 939 may be configured to synchronize operations of the image projection systems 301. Any data generated from the image processing unit 936 may be stored in the image processing unit 936 or in another suitable storage facility.

The detection of a location of the substrate 140 may allow for the adjustment of subsequent or concurrent processes. The detection of an orientation of the substrate 140 may allow for the forming of operations, based on the instructions, for the adjustment of other components controlled by the controller 702. The detecting of a location and an orientation of the substrate 140 may occur in real time. If instructions for the adjustment of the image projection systems 301 are not determined during the detecting of the location and the orientation of the substrate within the processing unit, such instructions may be determined via the controller 702 after the detecting is complete.

Furthermore, the at least two image projection systems 301 may be activated. Activation of least two image projection systems 301 may include powering on, testing, focusing, adjusting, and/or moving of the at least two image projection systems 301. An adjustment of the image projection systems 301, which may align the image projection systems 301 with the substrate, may occur after activating the image projection systems 301.

The at least two image projection systems 301 may be coordinated. The coordinating may synchronize the image projection systems 301 such that the image projection systems 301 position in sync and as a unit. The coordinating may further adjust the image projection systems 301 based on the instructions determined via the detection of a misalignment of the substrate 140. Furthermore, the at least two image projection systems 301 may be controlled. The controlling may align the at least two image projection systems 301 with an alignment of the substrate 140. The at least two image projection systems 301 may be controlled in parallel. The controlling of the at least two image projection systems 301 may occur in real time. As previously discussed, the image projection systems 301 may be aligned with the misalignment of the substrate 140, such that the image projection systems 301 and the substrate 140 are correctly aligned. Additionally, the substrate 140 may be processed in the processing unit.

In one embodiment, the at least two image projection systems 301 may be an array of image projection systems 301. The array may contain twenty-two image projection systems 301, or any other suitable number of image projection systems 301. The number of image projection systems 301 necessary as part of an array of image projection systems 301 may be dependent upon the size of the substrate 140 being processed. The array of image projection systems 301 may be controlled in parallel.

In another embodiment, a computer system for performing the real time coordination of image projection systems 301 is disclosed. The computer system may comprise a processor and a memory. The memory may store instructions that, when executed by the processor, cause the computer system to detect a location and an orientation of a substrate 140 within a processing unit. The detecting may be accomplished through the use of sensors, lasers, lights, and/or any other suitable detecting means within the processing unit. The detecting may read a distortion of the substrate and determine instructions for the adjustment of the image projection systems 301. The instructions may be stored as data 938 in an image processing unit 936 of the storage 930 of the controller 702. The instructions, stored as data 938, may be updated as the substrate 140 is further processed. The image processing unit 936 may contain control logic 939 configured to apply the instructions for the adjustment of the image projection systems 301. The control logic 939 of the image processing unit 936 may be configured to synchronize operations of the image projection systems 301. Any data generated from the image processing unit 936 may be stored in the image processing unit 936 or in another suitable storage facility.

A detection of a location of the substrate 140 may allow for the adjustment of subsequent or concurrent processes. The detecting of an orientation of the substrate 140 may allow for the forming of operations, based on the instructions, for the adjustment of other components controlled by the controller 702. The detecting of a location and an orientation of the substrate 140 may occur in real time. If instructions for the adjustment of the image projection systems 301 are not determined during the detecting of the location and the orientation of the substrate within the processing unit, such instructions may be determined via the controller 702 after the detecting is complete.

During processing at least two image projection systems 301 may be activated. Activation of least two image projection systems 301 may include powering on, testing, focusing, adjusting, and/or moving of the at least two image projection systems 301. An adjustment of the image projection systems 301 which may align the image projection systems 301 with the substrate may occur after activating the image projection systems 301.

The computer system may coordinate the at least two image projection systems 301. The coordinating may synchronize the image projection systems 301 such that the image projection systems 301 position in sync and as a unit. The coordinating may further adjust the image projection systems 301 based on the instructions determined via the detection of a misalignment of the substrate 140. Furthermore, the computer system may control the at least two image projection systems 301. The controlling may align the at least two image projection systems 301 with an alignment of the substrate 140. The at least two image projection systems 301 may be controlled in parallel. The controlling of the at least two image projection systems 301 may occur in real time. As previously discussed, the image projection systems 301 may be aligned to be with the misalignment of the substrate 140, such that the image projection systems 301 and the substrate 140 are aligned. Additionally, the substrate 140 may be processed in the processing unit.

In yet another embodiment, a non-transitory computer-readable medium storing instructions that, when executed by a processor, cause a computer system to coordinate image projection systems in real time is disclosed. The non-transitory computer-readable medium may perform the steps of detecting a location and an orientation of a substrate 140 within a processing unit. The detecting may be accomplished through the use of sensors, lasers, lights, and/or any other suitable detecting means within the processing unit. The detecting may read a distortion of the substrate and determine instructions for the adjustment of the image projection systems 301. The instructions may be stored as data 938 in an image processing unit 936 of the storage 930 of the controller 702. The instructions, stored as data 938, may be updated as the substrate 140 is further processed. The image processing unit 936 may contain control logic 939 configured to apply the instructions for the adjustment of the image projection systems 301. The control logic 939 of the image processing unit 936 may be configured to synchronize operations of the image projection systems 301. Any data generated from the image processing unit 936 may be stored in the image processing unit 936 or in another suitable storage facility.

A detection of a location of the substrate 140 may allow for the adjustment of subsequent or concurrent processes. The detecting of an orientation of the substrate 140 may allow for the forming of operations, based on the instructions, for the adjustment of other components controlled by the controller 702. The detecting of a location and an orientation of the substrate 140 may occur in real time. If instructions for the adjustment of the image projection systems 301 are not determined during the detecting of the location and the orientation of the substrate within the processing unit, such instructions may be determined via the controller 702 after the detecting is complete.

The non-transitory computer-readable medium may also perform the steps of activating the at least two image projection systems 301. Activation of least two image projection systems 301 may include powering on, testing, focusing, adjusting, and/or moving of the at least two image projection systems 301. An adjustment of the image projection systems 301 which may align the image projection systems 301 with the substrate may occur after activating the image projection systems 301.

The non-transitory computer-readable medium may also perform the steps of coordinating the at least two image projection systems 301, and controlling the at least two image projection systems. The coordinating may synchronize the image projection systems 301 such that the image projection systems 301 position in sync and as a unit. The coordinating may further adjust the image projection systems 301 based on the instructions determined via the detection of a misalignment of the substrate 140. The controlling may align the at least two image projection systems 301 with an alignment of the substrate 140. The at least two image projection systems 301 may be controlled in parallel. The controlling of the at least two image projection systems 301 may occur in real time. As previously discussed, the image projection systems 301 may be aligned to be with the misalignment of the substrate 140, such that the image projection systems 301 and the substrate 140 are perfectly aligned. Additionally, the substrate 140 may be processed in the processing unit.

Figure 10:
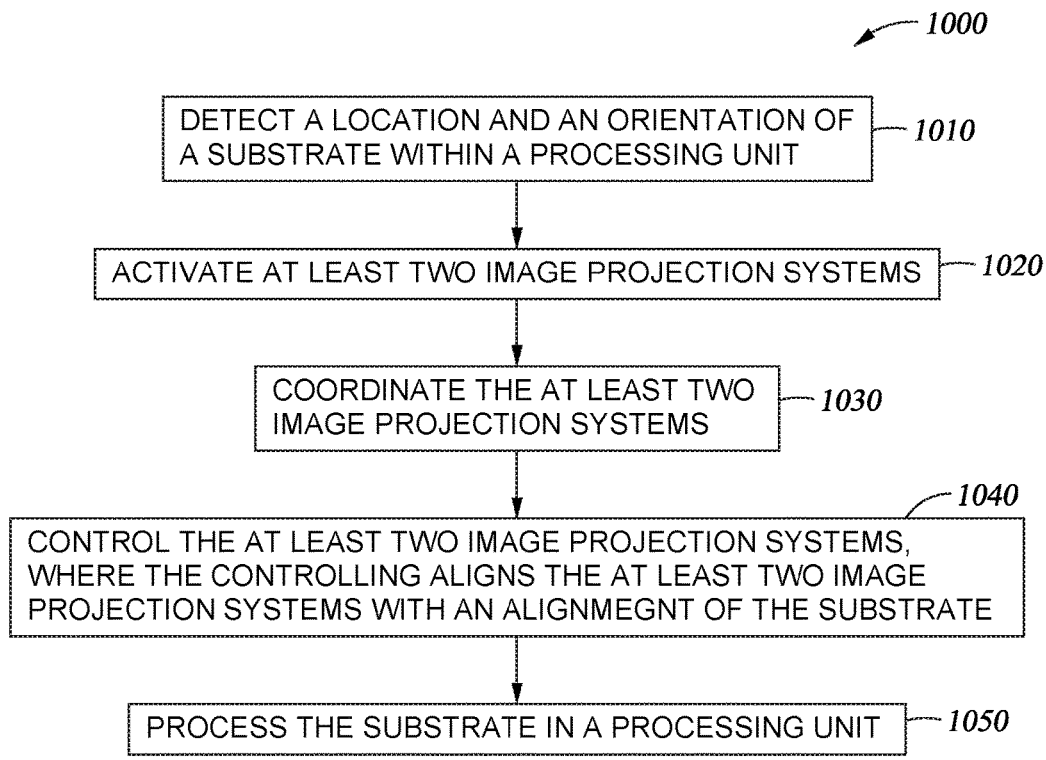
FIG. 10 schematically illustrates operations of a method for the real time coordination of image projection systems according to one embodiment described herein.

FIG. 10 schematically illustrates operations of a method 1000 for the real time coordination of image projection systems. The method 1000 generally relates to the use of parallel computation to provide the real time coordination, synchronization, and management of any number of image projection systems 301 during maskless lithography patterning in a manufacturing process. At operation 1010, a location and an orientation of a substrate within a processing unit is detected. At operation 1020, at least two image projection systems are activated. At operation 1030, the at least two image projection systems are coordinated. At operation 1040, the at least two image projection systems are controlled. The controlling may align the at least two image projection systems with an alignment of the substrate. At operation 1050, the substrate is processed in the processing unit.

The real time software and array control application allows the image projection systems 301 to be synchronized, ran in parallel, and controlled by a central controller. The utilization of a central controller allows for coordination amongst each of the image projection systems 301. Furthermore, the real time detection of a misalignment of a substrate allows for the real time adjustment of the image projection systems, such that the image projection systems may align with the substrate.

While the foregoing is directed to embodiments described herein, other and further embodiments may be devised without departing from the basic scope thereof. For example, aspects of the present disclosure may be implemented in hardware or software or in a combination of hardware and software. One embodiment described herein may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (for example, read-only memory devices within a computer such as CD-ROM disks readable by a CD-ROM drive, flash memory, ROM chips or any type of solid-state non-volatile semiconductor memory) on which information is permanently stored; and (ii) writable storage media (for example, floppy disks within a diskette drive or hard-disk drive or any type of solid-state random-access semiconductor memory) on which alterable information is stored. Such computer-readable storage media, when carrying computer-readable instructions that direct the functions of the disclosed embodiments, are embodiments of the present disclosure.

It will be appreciated to those skilled in the art that the preceding examples are exemplary and not limiting. It is intended that all permutations, enhancements, equivalents, and improvements thereto that are apparent to those skilled in the art upon a reading of the specification and a study of the drawings are included within the true spirit and scope of the present disclosure. It is therefore intended that the following appended claims include all such modifications, permutations, and equivalents as fall within the true spirit and scope of these teachings.

What is claimed is:

1. A method foe real time coordination of image projection systems, sequentially comprising:
    positioning a first substrate on a first stage of a plurality of stages, each stage moveable between a processing position located adjacent to a processing unit comprised of a plurality of image projection systems and a loading position located away from the processing unit;
    moving the first stage from the loading position to the processing position;
    detecting a location and an orientation of the first substrate within the processing unit;
    activating at least two image projection systems of the plurality of image projection systems;
    moving the at least two image projection systems such that the at least two image projection systems are aligned with the first substrate;
    coordinating the at least two image projection systems;
    controlling the at least two image projection systems, wherein the controlling aligns the at least two image projection systems with an alignment of the first substrate; and
    patterning the fist substrate in the processing unit, the patterning comprising:
        processing a plurality of graphical objects into a plurality of convex polygons to define a layout pattern to be formed on the first substrate;
        modifying the layout pattern based on the detected location and orientation of the first substrate; and
        performing a maskless photolithography process to form the layout pattern on the first substrate.

2. The method of claim 1, wherein the at least two image projection systems are controlled in parallel synchronously.

3. The method of claim 1, wherein the detecting and controlling occur in real time.

4. The method of claim 1, wherein the coordinating synchronizes the image projection systems.

5. The method of claim 4, wherein the detecting reads a distortion of the first substrate and determines instructions for the adjustment of the image projection systems.

6. The method of claim 5, wherein the coordinating further adjusts the image projection systems based on the instructions.

7. The method of claim 1, further comprising determining instructions for the adjustment of the image projection systems after the detecting.

8. The method of claim 1, wherein the at least two image projection systems is an array of image projection systems, the array containing twenty-two image projection systems, wherein the image projection systems of the array are controlled in parallel.

9. A computer system for performing real time coordination of image projection systems, comprising:
    a processor; and
    a memory storing instructions that, when executed by the processor, cause the computer system to sequentially:
        position a first substrate on a first stage of a plurality of stages, each stage moveable between a processing position located adjacent to a processing unit comprised of a plurality of image projection systems and a loading position located away from the processing unit;
        move the first stage from the loading position to the processing position;
        detect a location and an orientation of the first substrate within the processing unit;
        activate at least two image projection systems of the plurality of image projection systems;
        move the image projection systems such that the at least two image projection systems are aligned with the first substrate;
        coordinate the at least two image projection systems;
        control the at least two image projection systems, wherein the controlling aligns the at least two image projection systems with an alignment of the first substrate; and
        pattern the first substrate in the processing unit, the pattern comprising:
            processing a plurality of graphical objects into a plurality of convex polygons to define a layout pattern to be formed on the first substrate:
            modifying the layout pattern based on the detected location and orientation of the first substrate; and
            performing a maskless photolithography process to form the layout pattern on the first substrate.

10. The computer system of claim 9, wherein the at least two image projection systems are controlled in parallel synchronously.

11. The computer system of claim 9, wherein the detecting and controlling occur in real time.

12. The computer system of claim 9, wherein the coordinating synchronizes the image projection systems.

13. The computer system of claim 12, wherein the detecting reads a distortion of the first substrate and determines instructions for the adjustment of the image projection systems.

14. The computer system of claim 13, wherein the coordinating further adjusts the image projection systems based on the instructions.

15. The computer system of claim 9, further comprising determining instructions for the adjustment of the image projection systems after the detecting.

16. The computer system of claim 9, wherein the at least two image projection systems is an array of image projection systems, the array containing twenty-two image projection systems, wherein the image projection systems of the array are controlled in parallel.

17. A non-transitory computer-readable medium storing instructions that, when executed by a processor, cause a computer system to coordinate image projection systems in real time, by sequentially performing the steps of:
positioning a first substrate on a first stage of a plurality of stages, each stage moveable between a processing position located adjacent to a processing unit comprised of a plurality of image projection systems and a loading position located away from the processing unit;
moving the first stage from the loading position to the processing position;
detecting a location and an orientation of the first substrate within the processing unit;
activating at least two image projection systems of the plurality of image projection systems;
moving the image projection systems such that the at least two image projection systems are aligned with the first substrate;
coordinating the at least two image projection systems;
controlling the at least two image projection systems, wherein the controlling aligns the at least two image projection systems with an alignment of the first substrate; and
patterning the first substrate in the processing unit, the patterning comprising:
processing a plurality of graphical objects into a plurality of convex polygons to define a layout pattern to be formed on the first substrate;
modifying the layout pattern based on the detected location and orientation of the first substrate; and
performing a maskless photolithography process to form the layout pattern on the first substrate.

18. The non-transitory computer-readable medium of claim 17, wherein the at least two image projection systems are controlled in parallel synchronously.

19. The non-transitory computer-readable medium of claim 17, wherein the detecting and controlling occur in real time.

20. The non-transitory computer-readable medium of claim 17, wherein the coordinating synchronizes the image projection systems.

21. The non-transitory computer-readable medium of claim 20, wherein the detecting reads a distortion of the first substrate and determines instructions for the adjustment of the image projection systems.

22. The non-transitory computer-readable medium of claim 21, wherein the coordinating further adjusts the image projection systems based on the instructions.

23. The non-transitory computer-readable medium of claim 17, further comprising determining instructions for the adjustment of the image projection systems after the detecting.

24. The non-transitory computer-readable medium of claim 17, wherein the at least two image projection systems is an array of image projection systems, the array containing twenty-two image projection systems, wherein the image projection systems of the array are controlled in parallel.

* * * * *